US006769939B2

(12) United States Patent
Neumann et al.

(10) Patent No.: US 6,769,939 B2
(45) Date of Patent: Aug. 3, 2004

(54) TERMINAL BLOCK FOR CONNECTING DATA AND POWER SUPPLY CONDUCTORS TO AN ELECTRICAL DEVICE

(75) Inventors: Heike Neumann, Rödermark (DE); Hubert Herrmann, Eppertshausen (DE); Klaus Steinmetz, Flörsheim (DE); Werner Beege, Hainburg (DE); Werner Radde, Babenhausen (DE)

(73) Assignee: Weidmueller Interface GmbH & Co., Detmold (DE)

( * ) Notice: Subject to any disclaimer, the term of this patent is extended or adjusted under 35 U.S.C. 154(b) by 0 days.

(21) Appl. No.: 10/407,206

(22) Filed: Apr. 7, 2003

(65) Prior Publication Data

US 2003/0224665 A1 Dec. 4, 2003

(30) Foreign Application Priority Data

Apr. 10, 2002 (DE) .......................................... 202 05 594

(51) Int. Cl.[7] .................................................. H01L 9/22
(52) U.S. Cl. ........................ 439/709; 439/638; 439/721
(58) Field of Search ................................ 439/709, 638, 439/639, 721

(56) References Cited

U.S. PATENT DOCUMENTS

| | | | | | |
|---|---|---|---|---|---|
| 5,658,172 | A | * | 8/1997 | Schmidt et al. | 439/716 |
| 5,713,766 | A | * | 2/1998 | Davies et al. | 439/709 |
| 5,741,161 | A | * | 4/1998 | Cahaly et al. | 439/709 |
| 6,074,241 | A | * | 6/2000 | Patel et al. | 439/441 |
| 6,074,255 | A | * | 6/2000 | Schultz et al. | 439/638 |
| 6,238,234 | B1 | * | 5/2001 | Sedlecky | 439/412 |
| 6,325,675 | B1 | * | 12/2001 | Harmeyer | 439/709 |

FOREIGN PATENT DOCUMENTS

| | | |
|---|---|---|
| DE | 28 22 245 A1 | 10/1979 |
| DE | 200 06 280 U1 | 9/2000 |
| DE | 101 08 948 A1 | 9/2002 |
| EP | 1 146 610 A1 | 10/2001 |

* cited by examiner

*Primary Examiner*—Gary F. Paumen
(74) *Attorney, Agent, or Firm*—Lawrence E. Laubscher, Sr.

(57) ABSTRACT

An electrical terminal block connector is provided for connecting a plurality of power supply conductors having a first cross-sectional area and a plurality of data input conductors having a smaller cross-sectional area with a plurality of output conductors having a uniform cross-sectional area. The connector includes a terminal block housing containing a chamber, first and second inlet openings communicating with the chamber for receiving the ends of the power conductors and the data conductors, respectively, and a plurality of outlet openings communicating with the chamber for connection with the ends of the output conductors, respectively. First and second connector devices are arranged in the chamber for connection with the ends of the power and data conductors, respectively, and a plurality of identical third connectors connected with the first and second connectors include tulip-shaped terminals that extend within corresponding outlet openings for connection with the output conductors, respectively. The first connectors include resilient terminals connected by buses with the third connectors, and the second connectors include a data socket having outlet terminals connected with the third connectors via the conductors of a printed circuit board, respectively.

15 Claims, 6 Drawing Sheets

TERMINAL BLOCK FOR CONNECTING DATA AND POWER SUPPLY CONDUCTORS TO AN ELECTRICAL DEVICE

BACKGROUND OF THE INVENTION

1. Field of the Invention

A terminal block connector is provided for connecting a plurality of power supply conductors having a first cross-sectional area and a plurality of data inlet conductors of smaller cross-sectional area with a plurality of output conductors having a uniform cross-sectional area.

2. Brief Description of the Prior Art

Terminal block connectors are known in the prior art for supplying power and data information to a plurality of electrical loads, such as electrical appliances, the heating and air conditioning control systems of a building, or the like. One problem that arises is the difficulty of simply and quickly connecting input conductors of different sizes and cross-sectional areas to a plurality of output conductors of uniform cross-sectional dimensions. For example, telephone and computer data input lines have a much smaller cross-sectional areas than 120 volt or 230 volt power supply conductors, and different considerations must be taken into account for connecting these lines to the output conductors. In the case of power supply lines, resilient terminals are normally used in the art, while data input conductors make use of jacks and plug connectors, such as the well-known RJ45 plug and socket connector. As a consequence of the very small diameters of the data input conductors, great care must be exercised during installation of equipment to avoid the breaking or rupturing of the data leads at the pint of contact, which breaking of an insulated conductor is not visible and is difficult to detect.

The present invention was developed to avoid the above and other drawbacks of the known connection devices, and to provide an improved terminal block connector for positively, quickly and safely connecting power supply and data input conductors to plurality of output conductors having a uniform diameter.

SUMMARY OF THE INVENTION

Accordingly, a primary object of the present invention is to provide a terminal block connector for connecting a plurality of power supply conductors of one size and a plurality of data input conductors of a smaller size with a plurality of output conductors of uniform size. First and second connecting means are arranged within the terminal block for connection with the ends of the power supply and data input conductors that are introduced within the chamber via first and second terminal block inlet openings, respectively. Third connecting means connected with the first and second connecting means are arranged in a plurality of terminal block output openings for connection with output conductors of uniform size, respectively.

According to another object of the invention, the portion of the terminal block containing the outlet openings is in the form of a male plug with the outlet openings arranged in a row for connection with a female receptacle that carries the output conductors. Similarly, the data input conductors are carried by a data plug, such as the well-known RJ45 telephone plug, that is adapted for insertion within a corresponding socket connector mounted in an inlet opening contained in the terminal block. Locking means may be provided for locking the output plug with the terminal block housing.

In accordance with a more specific object of the invention, the first connecting means comprise resilient terminals that are connected with the ends of the power supply conductors and are connected with first tulip-shaped output terminals via bus bar conductors, respectively. The data input socket includes a plurality of data output contacts that are connected with second resilient tulip-shaped output terminals via conductors on a printed circuit board, and soldering pins that extend through holes in the printed circuit board. The groups of first and second tulip-shaped terminals are arranged within the terminal block output openings for connection with the output conductors, respectively. The terminal block may be of sectional construction and includes removable cover sections for the first and second connectors.

The present invention offers the advantage that the danger of rupture of the fragile data conductors is reduced by using specific plugs for the connection of the data lines. Furthermore, the invention provides a simple, fast and compact connection of the data lines by the use of prefabricated data plugs. The power supply lines remain individually separable and connectable. Conventional industrial power supply plugs can serve as the output plug fr the system.

A further advantage is that the data lines can be connected to and disconnected from the terminal block without disturbing the power supply connections. On the other hand, it is quite simple to disconnect both the power supply conductors and the data conductors from the electrical appliance or load. Thus, the customer's appliance need not be altered in spite of a change in the connection technique on the input side of the terminal block.

Preferably, the output terminals are arranged in a row in strip-fashion on the housing, or are combined in a socket or plug strip, or as soldering connections on the terminal block housing. By the use of standard data plugs, the terminal block assembly is particularly resistant to damage by rupture due to vibration without any need for resorting to the use of conductors of larger diameter. The use of either an RJ45 plug or an RJ45 socket for the data line connections is within the scope of the present invention, and the male and female output plugs may be reversed as well, thereby to further reduce the danger of rupture of the data input lines.

Preferably, the first connector means for the power supply lines includes spring contacts, but other connections might be used as well, for example, crimping connections, screw connections, or IDC insulation-piercing contacts, or leaf spring contacts. By using hybrid connecting techniques, i.e., by employing different connecting techniques for the power supply and data input conductors, one can design variations in the connections where the power supply connections could be of the insulation-piercing type. The output plug connections could be a male pin strip, a female plug connector, an insertible printed circuit device, a SMT technique with soldering pins, or the THR technique.

BRIEF DESCRIPTION OF THE DRAWINGS

Other objects and advantages of the invention will become apparent from a study of the following specification when viewed in the light of the accompanying drawing, in which.

DETAILED DESCRIPTION

Figure 1:
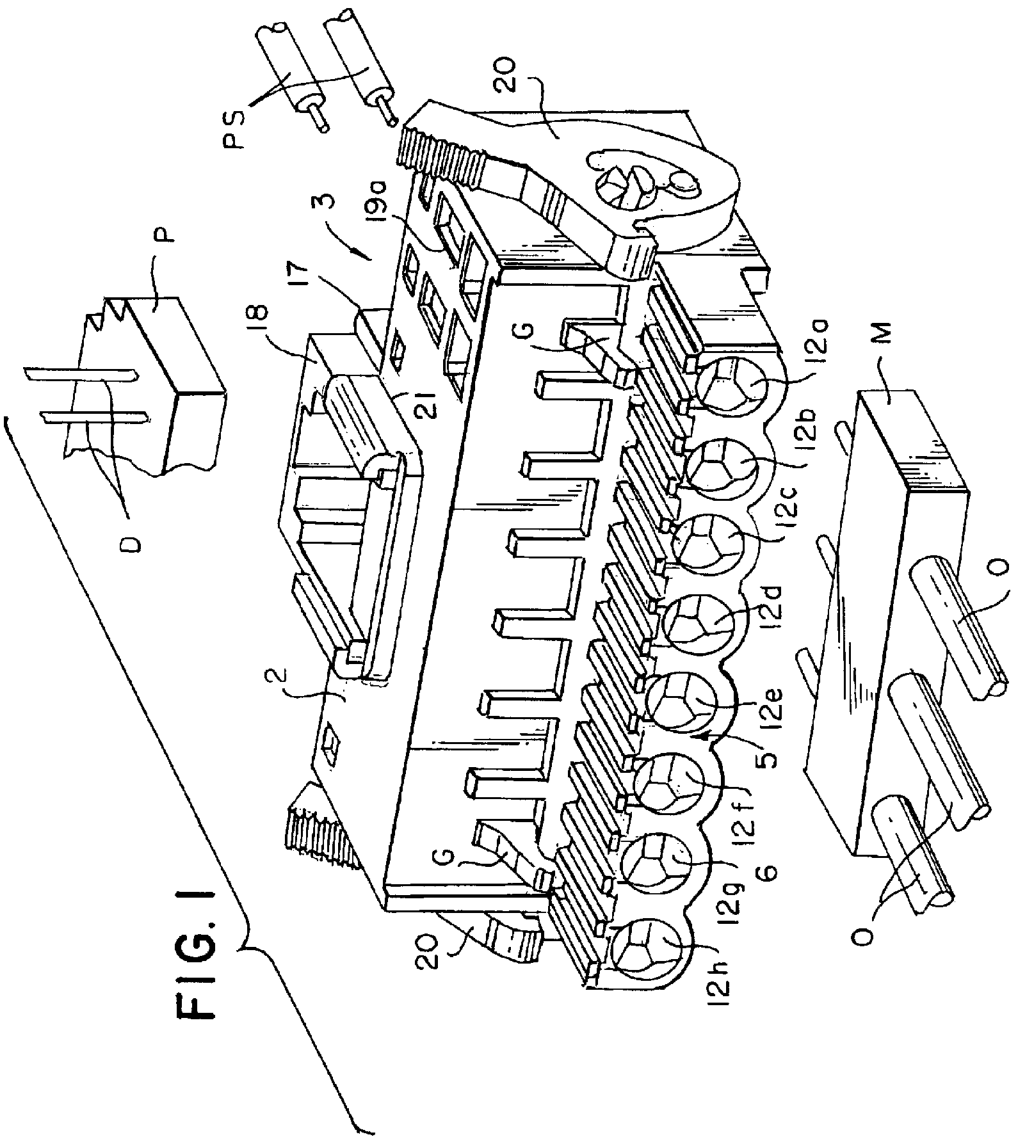
FIGS. 1 and 2 are front and rear perspective views, respectively, of the terminal block assembly of the present invention.

Referring first more particularly to FIG. 1, the present invention includes a generally rectangular terminal block housing 2 formed of an electrically insulating synthetic plastic material, the rear side of the terminal block containing a chamber 9 that is closed by a pair of removable rear cover sections 16 and 17. The terminal block contains a first pair of inlet openings 3*a* and 3*b* communicating with said chamber 9 and operable to receive a pair of power supply conductors PS, respectively. The terminal block also contains a second inlet opening 21 for receiving a data socket 18, such as an RJ45 socket, that is adapted for connection with a data plug P, such as an RJ45 data plug, that carries a plurality of relatively-thin and delicate data conductors D the diameters of which are less than those of the power supply conductors. Finally, a row of outlet openings 12 are provided in a strip portion 5 defined on the front of the terminal block 2, the strip portion being adapted for plug-in connection with the female output plug M that carries a plurality of output conductors O having a uniform cross-sectional area, and a row of male contacts arranged for engagement with the tulip-shaped terminals 11, respectively. A pair of guide projections extend forwardly of the terminal block for connection with corresponding guide slots contained in the plug M, and locking levers 20 are provided for locking the plug M to the terminal block 2.

Figure 3:
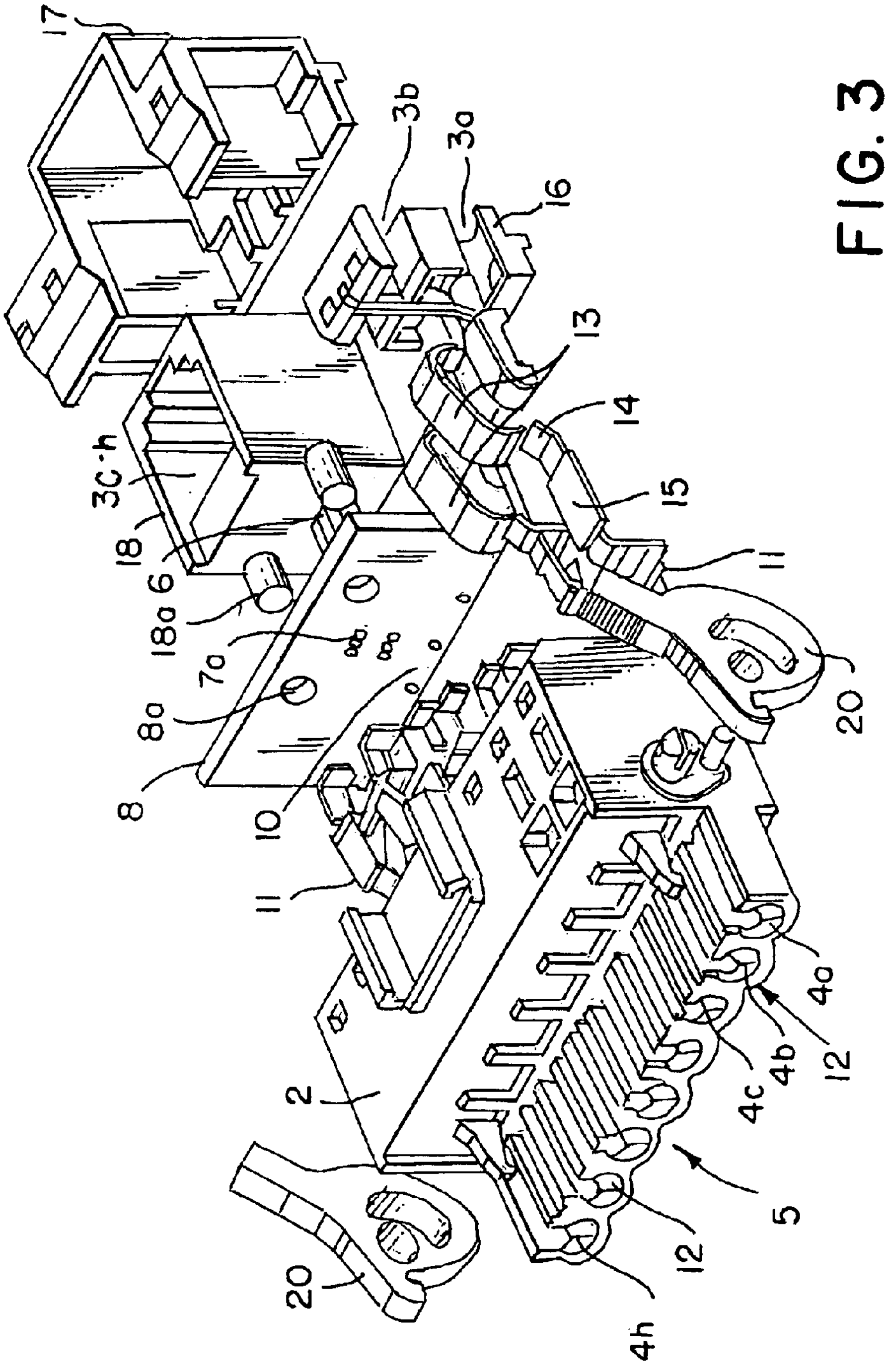
FIGS. 3 and 4 are exploded front and rear views of the terminal block assembly of FIGS. 1 and 2, respectively.
Figure 4:
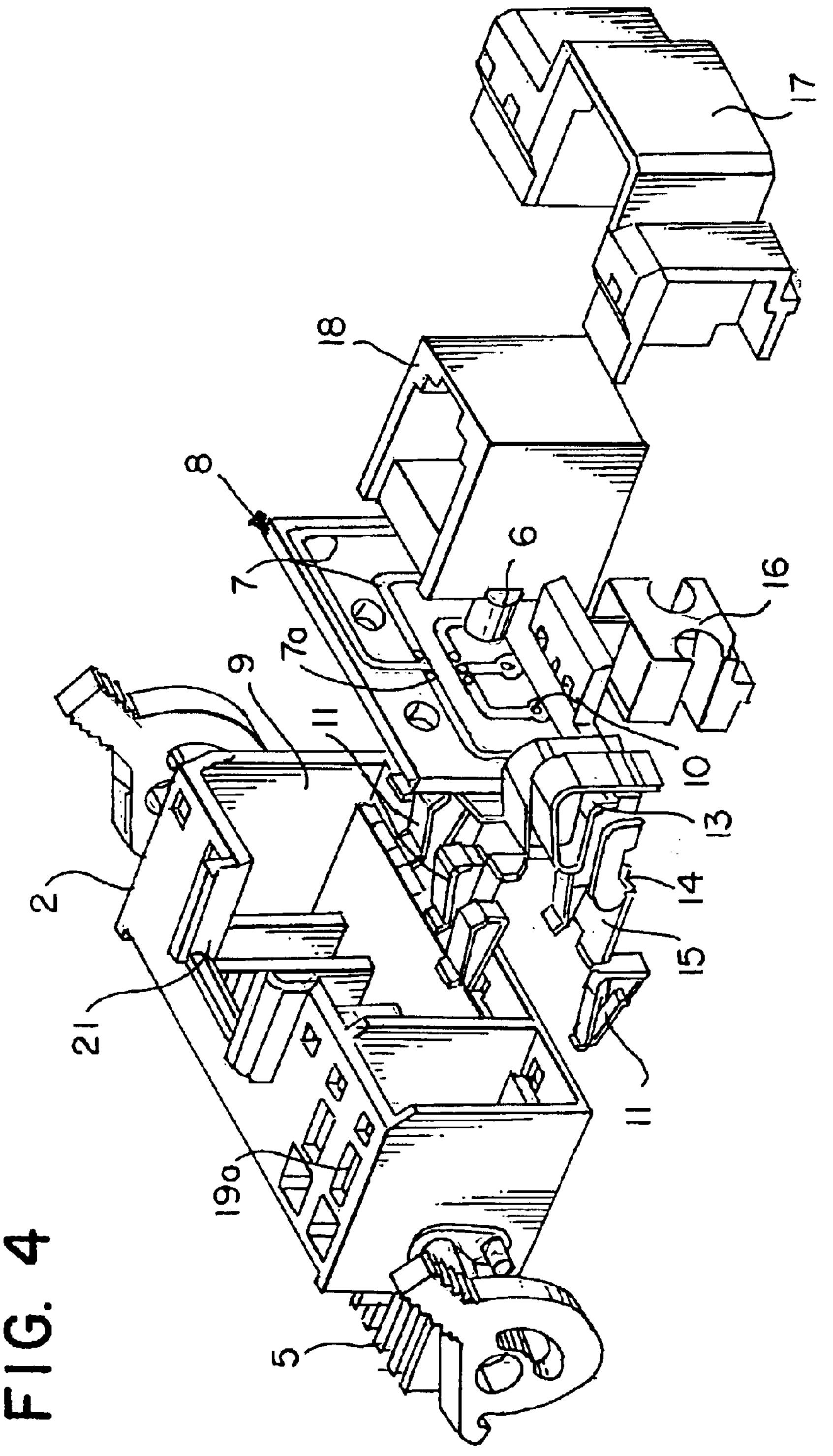
Figure 5:
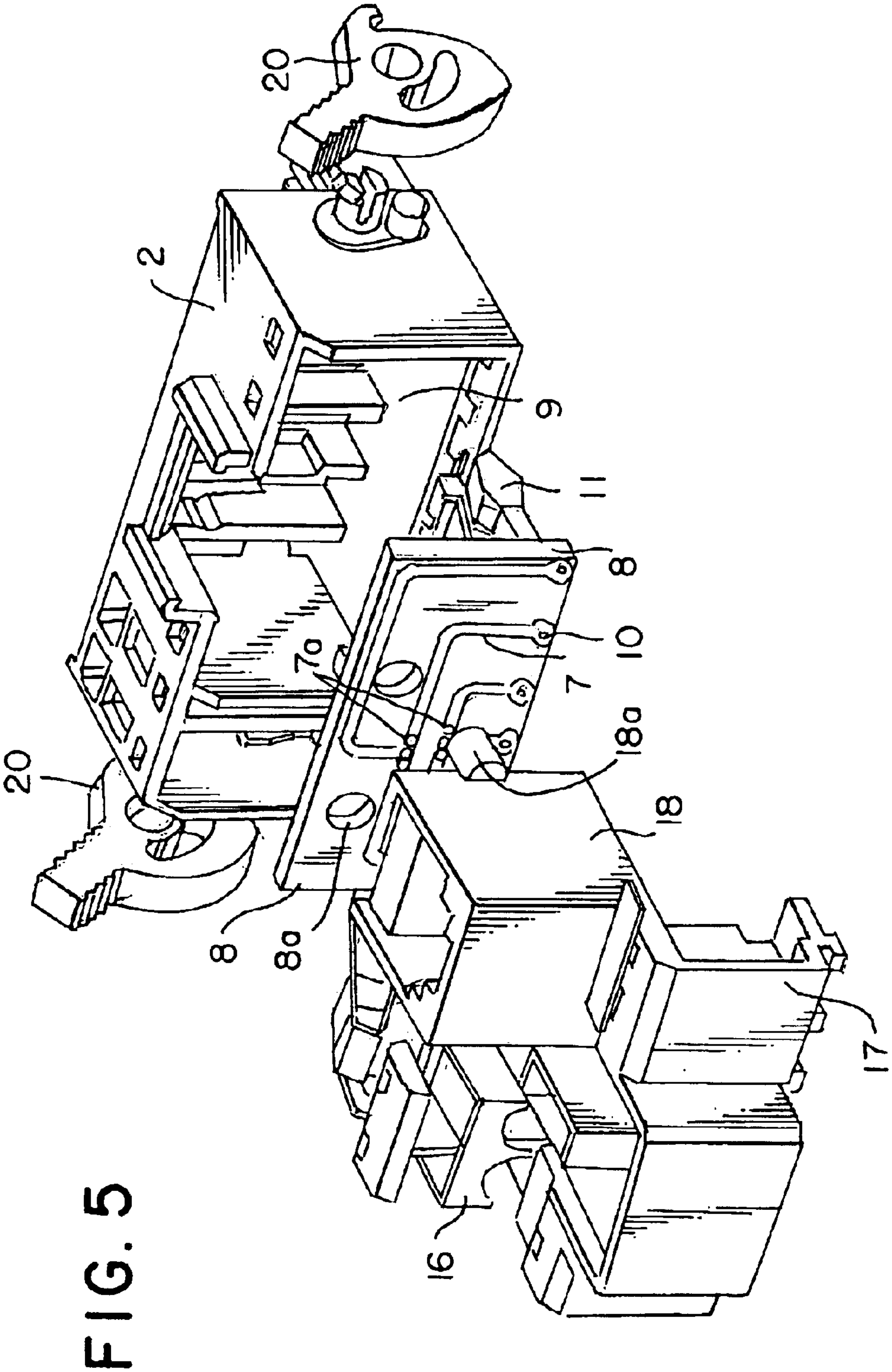
FIG. 5 is another exploded rear perspective view, for illustrative purposes, corresponding to FIG. 4.
Figure 6:
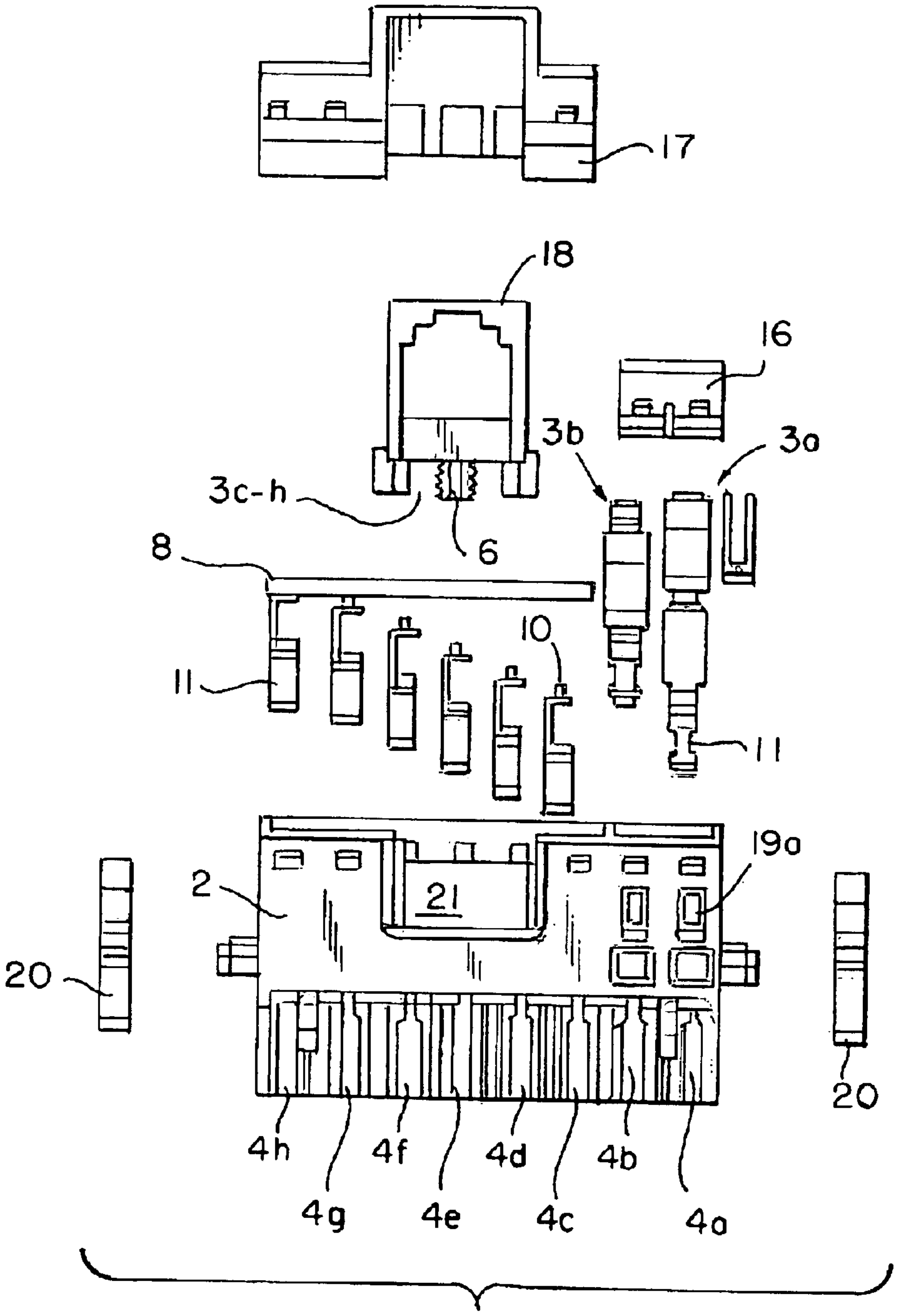
FIG. 6 is an exploded top view of the apparatus.

Referring to FIGS. 3–5, the terminal block chamber 9 contains first connecting means including resilient spring contacts 13 arranged for clamping engagement with the bare ends of the power supply conductors PS that are inserted into the chamber 9 via the first inlet openings 3*a* and 3*b*, respectively. The contacts 13 are electrically connected, for example, by soldering, with the tab portions 14 of bus bars 15. In the preferred embodiment, these tab portions extend upwardly through corresponding slot openings contained in the resilient contacts 13 and serve as stops for engagement by the forward extremities of the bare end portions of the power supply conductors PS, respectively. Soldered to the other ends of the bus bars 15 are first tulip-shaped resilient terminals 11*a* and 11*b* that extend into corresponding outlet openings 12*a*, 12*b* contained in the terminal block housing, thereby to define the output connecting means 4*a* and 4*b*, respectively.

The data plug P is inserted within the socket 18 to cause the data input connectors 3*c*–3*h* to engage the contacts 6 that extend outwardly through the wall of the socket 18 into electrical engagement with the contact pins 7*a* at one end of a plurality of circuit conductors 7, respectively, that are arranged on the printed circuit board 8, as best shown in FIGS. 4 and 5. Preferably, the contacts 6 are soldered to the contact pins 7*a*, respectively. The circuit conductors 7 are connected at their other ends with first ends of soldering pins 10, respectively, that extend through corresponding openings contained in the circuit board soldered to the other ends of the soldering pins 10 are a second group of second tulip-shaped resilient terminals 11*c*–11*h* that extend into the associated outlet openings 12*c*–12*h* to define output connectors 4*c*–4*h*. As best shown in FIG. 3, the socket 18 is provided with forwardly extending guide projections 18*a* that extend within corresponding alignment openings 8*a* contained in the circuit board 8. The female output plug M is then connected with the strip portion 5 of the terminal block to electrically introduce the male contacts carried by the plug into the corresponding terminals 11*a*–11*h*, thereby to connect to the output connectors 4*a*–4*h* with the insulated output conductors O, all of which have the same uniform cross-sectional area.

Figure 2:
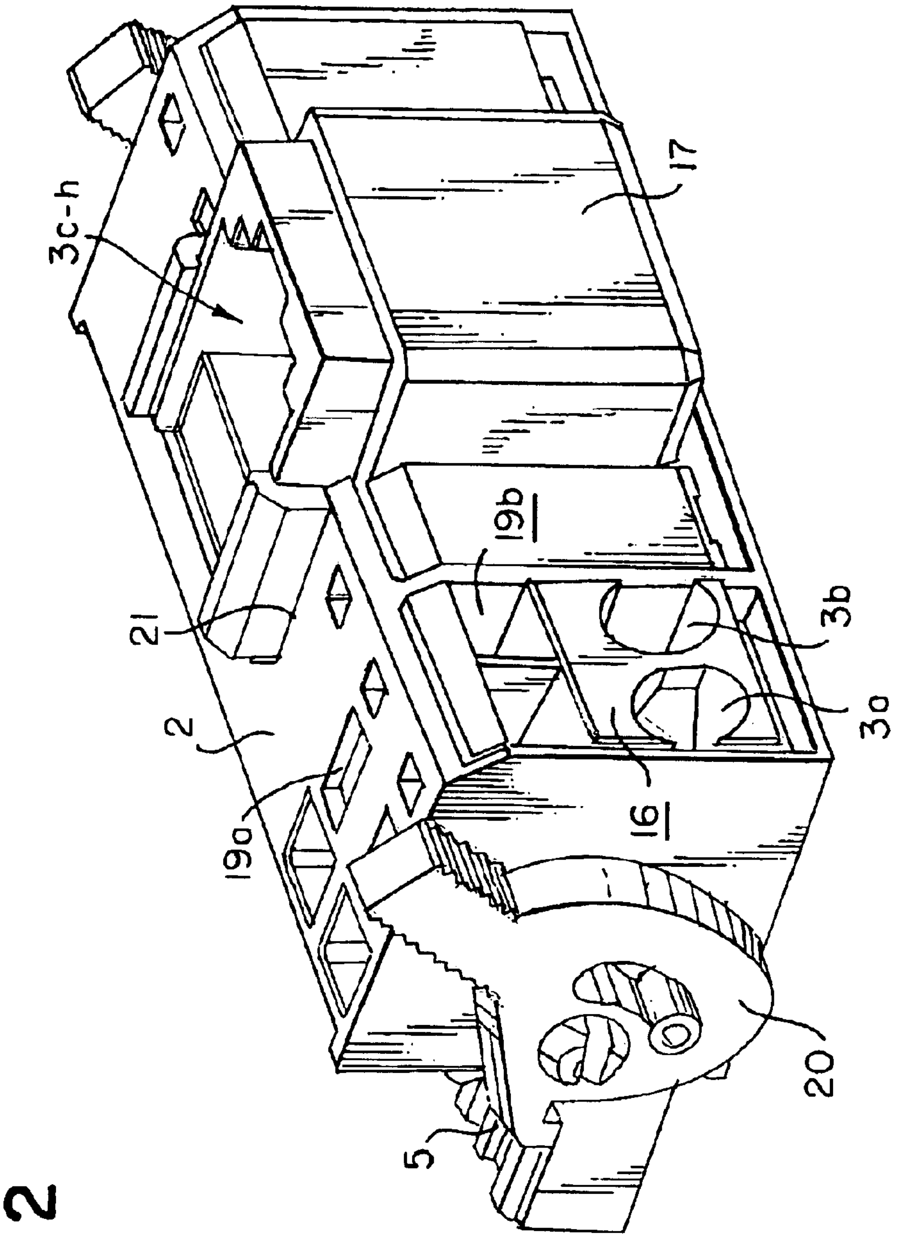

The housing further contains access openings 19*a* and 19*b* (FIG. 2) that afford access to the terminals 13 for engagement and disengagement operation by operating tools, not shown.

Although the invention has been described for use in connection with resilient input terminals 13, it is apparent that other types of input terminals could be used as well, as for example, insulation-piercing terminals, screw terminals or the like. Similarly, in place of the disclosed RJ45 data input plug, other data input connections, such as serial plugs or USB plugs, could be used as well. Furthermore, the printed circuit board 8 can be formed by means of a press-in technique, the SMT technique, with soldering pins, or the THR technique.

While in accordance with the provisions of the Patent Statutes the preferred forms and embodiments of the invention have been illustrated and described, it will be apparent to those skilled in the art that changes and modifications may be made without deviating from the inventive concepts set forth above.

What is claimed is:

1. An electrical connector for connecting a plurality of power supply conductors having a first cross-sectional area and a plurality of data input conductors having a smaller cross-sectional area to a plurality of output conductors having a uniform cross-sectional area, respectively, comprising:

(a) a terminal block housing (2) containing:
  (1) a chamber (9);
  (2) first inlet opening means (3*a*, 3*b*) communicating with said chamber, said first inlet opening means being adapted to receive said power supply conductors;
  (3) second inlet opening means (21) communicating with said chamber, said second inlet opening means being adapted to receive said data inlet conductors; and
  (4) a plurality of outlet openings (12) communicating with said chamber; and (b) connecting means for connecting the ends of power supply conductors and data input conductors introduced within said chamber via said first and second inlet openings, respectively, with a plurality of output conductors of uniform cross-sectional area associated with said outlet openings, respectively, including:
  (1) first (13–15) and second (6–8) electrical connecting means contained within said housing chamber adjacent said first and second inlet openings for connection with the ends of power supply conductors and data inlet conductors, respectively; and
  (2) third electrical connector means (11) arranged in said outlet openings for connecting said first and said second connecting means with said output conductors, respectively.

2. An electrical connector as define in claim 1, wherein said housing includes a front wall containing a plurality of outlet openings (12) arranged in a row extending transversely of said housing.

3. An electrical connector as defined in claim 2, wherein the portion of said housing containing said outlet openings is in the form of a plug strip (5).

4. An electrical connector as defined in claim 3, wherein said first connecting means includes a plurality of resilient terminals (13) arranged for connection with said power supply conductors, respectively.

5. An electrical connector as defined in claim 1, wherein said second connecting means include a data socket (18) removably connected with said housing second inlet opening means.

6. An electrical connector as defined in claim 5, and further including a data input plug (P) adapted for insertion within said data socket, said data input plug carrying a plurality of said data conductors (3*c*–3*h*).

7. An electrical connector as defined in claim 6, wherein said data socket (18) includes a plurality of data output contacts (6) corresponding with said data conductors, respectively; and a printed circuit board (8) having a first side carrying a plurality of conductors (7) having first ends connected with said data output contacts, respectively.

8. An electrical connector as defined in claim 7, wherein said third connecting means includes a plurality of first tulip-shaped resilient terminals (11*a*, 11*b*) connected with said resilient terminals (13) by connecting buses (15) and extending within corresponding a first group (12*a*, 12*b*) of said housing outlet openings, respectively.

9. An electrical connector as defined in claim 8, wherein said printed circuit board conductors are respectively connected at their other ends with first ends of a plurality of electrical soldering contacts (10) that extend through openings contained in said printed circuit board to the other side thereof, respectively; and further wherein said third connecting means includes a plurality of second tulip-shaped resilient terminals (11*c*–11*h*) connected with the other ends of said soldering contacts and extending within a second group (12*c*–12*h*) of said housing outlet openings, respectively.

10. An electrical connector as defined in claim 1, and wherein said terminal block housing further includes a pair of cover sections (16,17) removably connected with said housing to enclose said first and second electrical connecting means, respectively.

11. An electrical connector as defined in claim 3, wherein said first and second inlet opening means are transversely spaced relative to said housing.

12. An electrical connector as defined in claim 11, wherein said plug strip (5) comprises a male portion of said terminal block housing.

13. An electrical connector as defined in claim 12, and further including a female plug (M) adapted for connection with said housing male strip portion.

14. An electrical connector as defined in claim 13, and further including releasable locking means (20) for locking said female male plug strip to said housing connector strip portion.

15. An electrical connector as defined in claim 7, wherein said printed circuit board with soldering pins is formed by a press-in technique, an SMT technique, or by way of a THR technique.

* * * * *